United States Patent
Tsai et al.

(10) Patent No.: US 7,696,623 B2
(45) Date of Patent: Apr. 13, 2010

(54) ELECTRONIC CARRIER BOARD AND PACKAGE STRUCTURE THEREOF

(75) Inventors: Fang-Lin Tsai, Taichung (TW); Ho-Yi Tsai, Taichung Hsien (TW); Chih-Ming Huang, Hsinchu Hsein (TW); Chien-Ping Huang, Hsinchu Hsein (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 510 days.

(21) Appl. No.: 11/643,147

(22) Filed: Dec. 20, 2006

(65) Prior Publication Data

US 2007/0145561 A1 Jun. 28, 2007

(30) Foreign Application Priority Data

Dec. 22, 2005 (TW) .............................. 94145804 A (51) Int. Cl.
*H01L 23/48* (2006.01)
*H01L 23/52* (2006.01)
*H01L 29/40* (2006.01)

(52) U.S. Cl. ...................... 257/737; 257/738; 257/779; 257/783; 257/787

(58) Field of Classification Search ................ 257/737, 257/738, 779, 783, 787; 361/767, 360, 768, 361/808, 743, 760; 174/52.4, 255, 258, 534, 174/535

See application file for complete search history.

(56) References Cited

U.S. PATENT DOCUMENTS 5,315,070 A * 5/1994 Maiwald ...................... 174/250
6,228,466 B1 * 5/2001 Tsukada et al. ............... 428/209
6,396,707 B1 * 5/2002 Huang et al. ................. 361/760
6,441,316 B1 * 8/2002 Kusui ........................... 174/260
6,521,997 B1   2/2003 Huang et al.
7,115,819 B1 * 10/2006 Rumsey ....................... 174/261
7,235,887 B2 * 6/2007 Lee et al. ..................... 257/783
7,312,403 B2 * 12/2007 Yamamoto ................... 174/260
7,465,885 B2 * 12/2008 Chi et al. ..................... 174/260
2003/0110624 A1 * 6/2003 Rumsey et al. ................. 29/840
2004/0067604 A1 * 4/2004 Ouellet et al. ............... 438/108
2007/0138632 A1 * 6/2007 Tsai et al. ..................... 257/724
2007/0164084 A1 * 7/2007 Tsai et al. ..................... 228/101

FOREIGN PATENT DOCUMENTS

TW    442934 B    6/2001

* cited by examiner

*Primary Examiner*—Zandra Smith
*Assistant Examiner*—Telly D Green
(74) *Attorney, Agent, or Firm*—Peter F. Corless; Steven M. Jensen; Edwards Angell Palmer & Dodge LLP (57) ABSTRACT

An electronic carrier board and a package structure thereof are provided. The electronic carrier board includes a carrier, at least one pair of bond pads formed on the carrier, and a protective layer covering the carrier. The protective layer is formed with openings for exposing the bond pads. A groove is formed between the paired bond pads and has a length larger than a width of an electronic component mounted on the paired bond pads. The groove is adjacent to one of the paired bond pads and communicates with a corresponding one of the openings where this bond pad is exposed. Accordingly, a clearance between the electronic component and the electronic carrier board can be effectively filled with an insulating resin for encapsulating the electronic component, thereby preventing voids and undesirable electrical bridging between the paired bond pads from occurrence.

10 Claims, 9 Drawing Sheets

ELECTRONIC CARRIER BOARD AND PACKAGE STRUCTURE THEREOF

FIELD OF THE INVENTION

The present invention relates to electronic carrier boards and package structures thereof, and more particularly, to an electronic carrier board applicable to surface mounted technology (SMT), and a package structure of the electronic carrier board.

BACKGROUND OF THE INVENTION

Electronic components have been continuously designed and fabricated to have a miniaturized profile in response to the progress of integrated circuit (IC) manufacturing technology, and with provision of large-scale and highly integrated electronic circuits, IC-based products have relatively complete functionality.

Conventionally, electronic components are mounted on an electronic carrier board (such as a printed circuit board (PCB), a circuit board, or a substrate) by through hole technology (THT). The electronic components used in the THT, as not able to be further reduced in size, are considered occupying a significant amount of space on the electronic carrier board. By the THT, the electronic carrier board needs to have through holes corresponding to pins of the electronic components, such that the electronic components with the pins coupled to the through holes of the electronic carrier board actually occupy space on both sides of the electronic carrier board, and further, solder joints formed at junctions of the electronic components and the electronic carrier board are relatively large. Due to these drawbacks, the THT is no longer used in the mounting process of electronic components, but instead, surface mounted technology (SMT) becomes widely employed nowadays to effectively mount electronic components on an electronic carrier board.

Using the SMT to mount electronic components, electrical connection ends (pins) of the electronic components are bonded to a surface of an electronic carrier board on which the electronic components are mounted, such that there is no need to form plenty of through holes in the electronic carrier board for accommodating the pins of the electronic components as in the case of using the THT. Further by the SMT, the electronic components can be disposed on both sides of the electronic carrier board, thereby greatly improving space utilization of the electronic carrier board. Compared with the electronic components used in the THT, the electronic components used in the SMT have smaller sizes such that more of these electronic components can be mounted on the electronic carrier board by the SMT, and also, the electronic components used in the SMT are more cost-effectively fabricated. These advantages make the SMT become the main technology for mounting electronic components on an electronic carrier board.

The SMT is further advantageous in view of the following aspects. As it becomes necessary to mount passive components (such as capacitors, resistors or inductors) on an electronic carrier board to maintain stable electrical quality of an electronic product, and the electronic product is being made compact in size and with low consumption of power, the THT using relatively large electronic components is not considered suitable and is gradually replaced by the SMT. This is because in the THT, through holes need to be formed in a circuit board to accommodate the pins of the electronic components and are spaced apart from each other by a distance corresponding to a pitch between the pins, and the electronic components with the pins coupled to the through holes occupy both sides of the circuit board, thereby leading to unsatisfactory space utilization of the circuit board. The SMT however does not have such drawbacks.

Figure 1A:
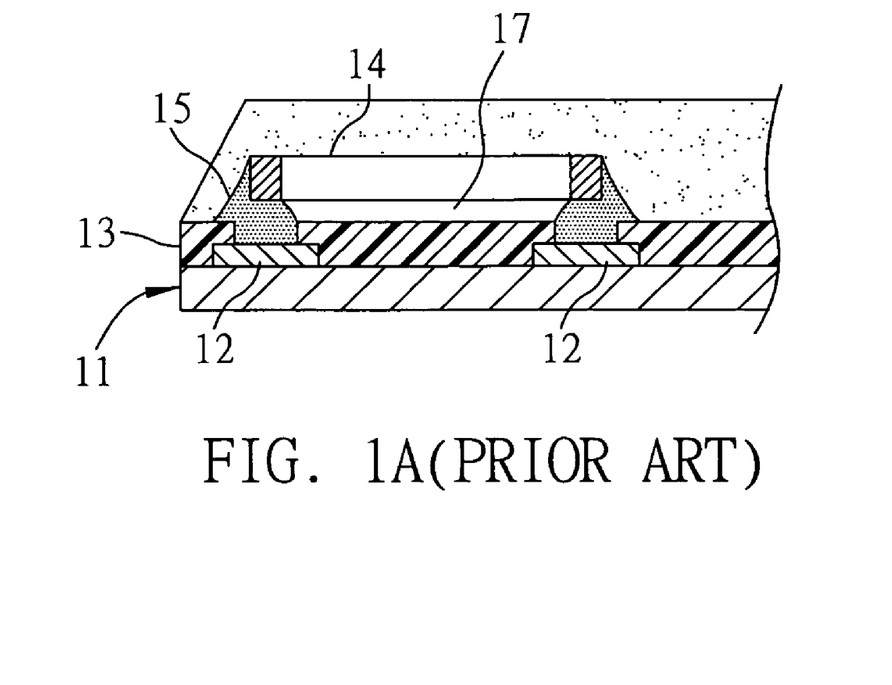
FIGS. 1A and 1B (PRIOR ART) are schematic diagrams showing a passive component mounted on a substrate by SMT conventionally.

FIG. 1A shows a passive components mounted on a substrate by the SMT. As shown, a pair of separate bond pads 12 are formed at predetermined positions on a substrate 11, and are exposed from a solder mask layer 13 covering the substrate 11. Each of the exposed bond pads 12 is a solder mask defined (SMD) bond pad whose periphery is covered by the solder mask layer 13 or a non-solder mask defined (NSMD) bond pad which is completely exposed from the solder mask layer 13. FIG. 1A is illustrated with solder mask defined (SMD) bond pads. With an appropriate amount of solder paste 15 being applied on the bond pads 12, two end portions of a passive component 14 can be bonded to the solder paste 15 and then subjected to a reflow soldering process, such that the passive component 14 is electrically connected to the bond pads 12 by means of the solder paste 15. In order to avoid a tombstone effect due to uneven amounts of the solder paste 15 applied to the two end portions of the passive component 14, openings of the solder mask layer 13 where the pair of bond pads 12 are exposed are made symmetrical in shape and equal in size so as to provide the solder paste 15 with same wetting areas on the bond pads 12.

Figure 1B:
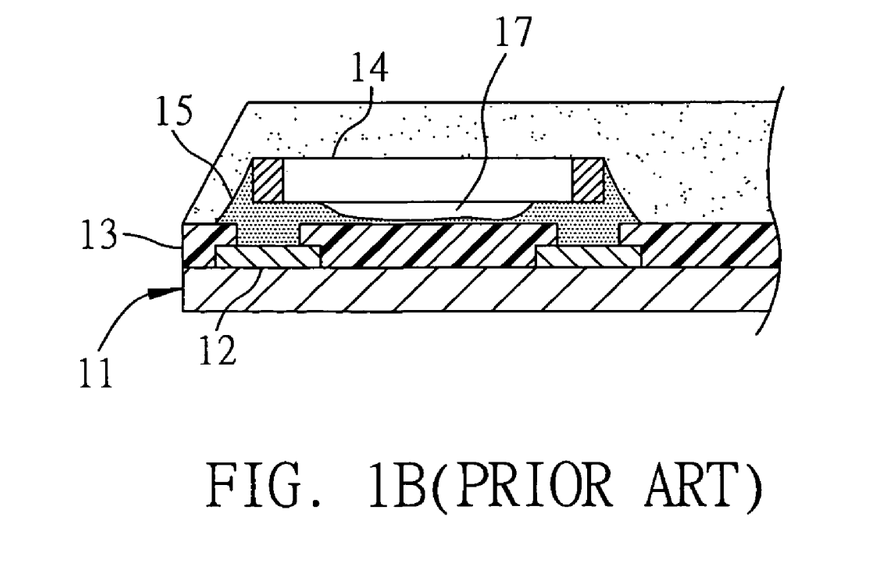

However, for a semiconductor package, it is found difficult to accurately control the height of the passive component 14 bonded to the solder paste 15 due to the amount of the solder paste 15 being used and melting of the solder paste 15 in the reflow soldering process. In case the solder mask layer 13 does not have a flat surface but is usually formed with recesses, a clearance 17 may be generated between the passive component 14 and the solder mask layer 13. The height of the clearance 17 is merely 10 to 30 μm, which is smaller than the size (about 50 μm) of fillers of an epoxy molding compound (EMC) used for encapsulating the passive component 14. As such, in a molding process, the clearance 17 cannot be completely filled with the EMC, and thus voids are formed. The voids result in a popcorn effect in a subsequent high-temperature operating environment, which undesirably damages the whole package structure. Furthermore, the melting solder paste 15 may flow into the clearance 17 (by a capillary action) and lead to undesirable electrical bridging and short circuit of the passive component 14 (as shown in FIG. 1B), thereby adversely affecting the yield of the fabricated package structure.

Figure 2:
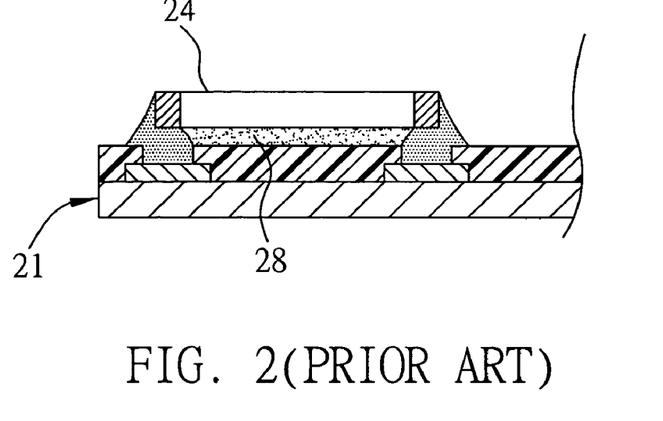
FIG. 2 (PRIOR ART) is a schematic diagram showing a passive component mounted on a substrate as disclosed in Taiwanese Patent No. 442934.

Accordingly, as shown in FIG. 2, Taiwan Patent No. 442934 discloses a method for mounting a passive component, which uses an electrically insulating material 28 such as epoxy resin to fill any possible clearance between a passive component 24 and a substrate 21 on which the passive component 24 is mounted, so as to avoid voids formed in the clearance and prevent a popcorn effect and electrical bridging of the passive component 24. However, such method undesirably increases the fabrication processes and cost.

Figure 3:
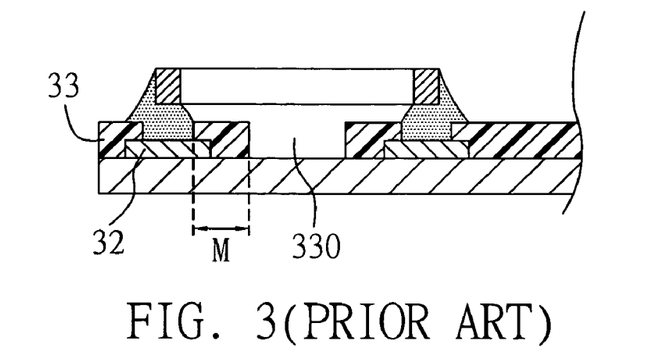
FIG. 3 (PRIOR ART) is a schematic diagram showing mounting of a passive component as disclosed in U.S. Pat. No. 6,521,997.

U.S. Pat. No. 6,521,997 provides another solution by additionally forming a groove 330 in a solder mask layer 33 and between openings of the solder mask layer 33 where a pair of bond pads 32 are exposed, as shown in FIG. 3, so as to enlarge the clearance to allow the EMC to pass through the clearance by means of the groove 330.

However, the size of the groove 330 is limited by the low resolution of the photosensitive solder mask layer 33, such that the smallest width of the groove that can be formed is 150 μm. Moreover, owing to the limitation in photomask alignment precision of the openings through which the bond pads are exposed, the minimum width M of the solder mask layer formed at an edge of each bond pad and around the corresponding opening is 75 μm. This thereby makes it more difficult to form the groove between the bond pads when the component size is being reduced.

The dimensions (e.g. length and width) of a passive component are currently presented by two 2-digit numbers in the semiconductor industry, for example, 0603-type or 0402-type passive component, wherein both the length and width are typically measured in British unit (such as inch), and generally the first 2-digit number presents the larger dimension (i.e. length) followed by the second 2-digit number representing the smaller dimension (i.e. width). Taking the 0402-type passive component as an example, 0402 means the passive component having specific dimensions of 0.040 inch (length)× 0.020 inch (width), which if being converted into SI unit, correspond to a length of 0.040×25.4 32 1.016 mm (approximately 1000 μm) and a width of 0.020×25.4=0.508 mm (approximately 500 μm). The 0402-type passive component usually has a height of 500 μm, which can be a chip capacitor, resistor or inductor.

Figure 4:
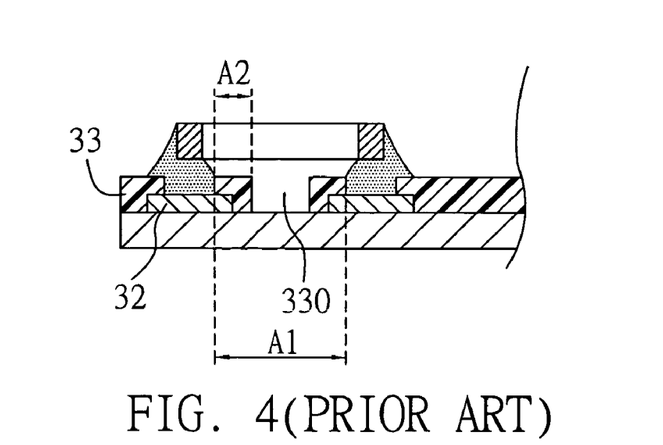
FIG. 4 (PRIOR ART) is a schematic diagram showing a 0201-type chip passive component bonded to a substrate conventionally.

Since semiconductor devices are being made with light weight and compact profile, a thin and fine ball grid array (TFBGA) semiconductor package has been downsized to have the thickness of an encapsulant reduced to 530 μm. Thus, the 0402-type chip passive component having a height of 500 μm becomes unable to be accommodated in such thin semiconductor package, but a smaller 0201-type chip passive component should be used instead so as to reduce the overall thickness of the package structure. The length, width and height of the 0201-type chip passive component are half of those of the 0402-type chip passive component, that is, the 0201-type chip passive component is of 500 μm (length)×250 μm (width)×250 μm (height). In light of the length (500 μm) of the small 0201-type chip passive component, spacing (A1), as shown in FIG. 4, between two paired bond pads on a substrate has to be decreased from 400 μm to 250 μm.

As described above, the solder mask layer is typically made of a photosensitive material, and due to the low photosensitive resolution and the limitation in photomask alignment precision of openings, the solder mask layer formed at the edge of each bond pad and around the corresponding opening must be at least 75 μm wide. If the technology disclosed in U.S. Pat. No. 6,521,997 of forming a 150 μm-wide groove in the solder mask layers and between the paired bond pads is applied, as shown in FIG. 4, the width A2 of the solder mask layer formed at the edge of each bond pad and around the corresponding opening becomes merely (250–150)/2=50 μm, which is smaller than the minimum width of 75 μm as required and thus goes beyond the capability of current technology.

Therefore, the problem to be solved is to provide an electronic carrier board, which can prevent voids and electrical bridging caused by a clearance present between the electronic carrier board and an electronic component mounted thereon, as well as allow small electronic components to be mounted on the electronic carrier board by SMT and the current process equipment and conditions.

SUMMARY OF THE INVENTION

In view of the above drawbacks of the prior art, a primary objective of the present invention is to provide an electronic carrier board and a package structure thereof, which allow an epoxy molding compound (EMC) to fill a space between the electronic carrier board and an electronic component mounted thereon, so as to prevent voids and electrical bridging from occurrence.

Another objective of the present invention is to provide an electronic carrier board and a package structure thereof, which allow a 0201-type chip passive component to be mounted on the electronic carrier board without having the problems of voids, a popcorn effect and electrical bridging.

Still another objective of the present invention is to provide an electronic carrier board and a package structure thereof, which allow a 0201-type chip passive component or an even smaller passive component to be mounted on the electronic carrier board by SMT without having the problem of an EMC failing to flow through a space between the electronic carrier board and the passive component.

A further objective of the present invention is to provide an electronic carrier board and a package structure thereof, which allow a 0201-type chip passive component or an even smaller passive component to be bonded on the electronic carrier board without having the problem of process failure due to the low resolution of a solder mask layer applied on the electronic carrier board.

A further objective of the present invention is to provide an electronic carrier board and a package structure thereof, so as to prevent a tombstone effect from occurrence when an electronic component is mounted on the electronic carrier board.

In order to achieve the above and other objectives, the present invention proposes an electronic carrier board comprising: a carrier, at least one pair of bond pads formed on a surface of the carrier, and a protective layer covering the surface of the carrier. The protective layer is formed with openings through which the bond pads are exposed. A groove is formed between the paired bond pads and has a length larger than a width of an electronic component to be mounted on the paired bond pads. The groove is adjacent to one of the paired bond pads and communicates with a corresponding one of the openings where the one of the paired bond pads is exposed. The length of the groove can be larger than or equal to a size of the corresponding one of the openings. The one of the paired bond pads at least partially abuts against the groove, or does not abut against the groove. The electronic carrier board can be a substrate, a circuit board or a printed circuit board. The protective layer can be a solder mask layer. The electronic component can be a passive component. The protective layer covers a peripheral portion of at least one of the bond pads, with a central portion of this bond pad being exposed, thereby making this bond pad formed as a solder mask defined (SMD) bond pad. Alternatively, at least one of the bond pads can be completely exposed from the protective layer, such that this bond pad is in the form of a non-solder mask defined (NSMD) bond pad. Moreover, the paired bond pads have equal areas exposed through the openings of the protective layer, so as to prevent a tombstone effect when the electronic component is mounted on the electronic carrier board.

In a preferred embodiment, the electronic carrier board comprises a carrier, a plurality of pairs of bond pads formed on a surface of the carrier, and a protective layer covering the surface of the carrier. The protective layer is formed with a plurality of openings through which the paired bond pads are exposed, such that a plurality of electronic components can be mounted side by side on the paired bond pads. A groove is formed between the paired bond pads and has a length larger than a spanning distance of the electronic components mounted side by side on the paired bond pads. The groove is adjacent to one row of the paired bond pads and communicates with corresponding ones of the openings where the one row of the paired bond pads are exposed.

In another preferred embodiment, the electronic carrier board comprises a carrier, a plurality of pairs of bond pads formed in two rows on a surface of the carrier, and a protective layer covering the surface of the carrier. The protective layer is formed with a plurality of openings through which the paired bond pads are exposed, such that a large passive component, which comprises a plurality of component units connected in parallel or in series, can be mounted on the two rows of the bond pads. A groove is formed between the two rows of the bond pads and has a length larger than a width of the passive component. The groove is adjacent to one of the two rows of the bond pads and communicates with corresponding ones of the openings where the one of the two rows of the bond pads are exposed.

The present invention also discloses a package structure of the above electronic carrier board, comprising the electronic carrier board, an electronic component, and an insulating resin. The electronic carrier board comprises a carrier, at least one pair of bond pads formed on a surface of the carrier, and a protective layer covering the surface of the carrier. The protective layer is formed with openings through which the paired bond pads are exposed. A groove is formed between the paired bond pads. The groove is adjacent to one of the paired bond pads and communicates with a corresponding one of the openings where the one of the paired bond pads is exposed. The electronic component is mounted on and electrically connected to the paired bond pairs exposed through the openings, wherein the groove has a length larger than a width of the electronic component. The insulating resin, such as an epoxy molding compound (EMC), encapsulates the electronic component and fills a clearance between the electronic component and the electronic carrier board.

The present invention also discloses a bond pad structure, which is covered by a protective layer, wherein the protective layer is formed with an opening through which the bond pad is partially exposed, and the opening communicates with a groove having a length larger than a size of the opening. The bond pad can at least partially abut against the groove or does not abut against the groove.

Compared with the prior art, the electronic carrier board and the package structure thereof in the present invention have a groove formed between at least one pair of bond pads provided on the electronic carrier board. The groove is adjacent to one of the paired bond pads, and communicates with an opening of a solder mask layer (or a protective layer) through which this bond pad is exposed. By such arrangement, within the capability of resolution of the solder mask layer, a space capable of accommodating an EMC is formed between the paired bond pads, such that the EMC can effectively fill a clearance between the electronic carrier board and an electronic component mounted thereon, and a void-induced popcorn effect and undesirable electrical bridging are prevented.

By the above arrangement, even if a compact electronic component, such as a 0201-type chip passive component, is mounted on the electronic carrier board, the EMC can still effectively fill the clearance between such electronic component and the electronic carrier board under the current process conditions, thereby preventing a popcorn effect and electrical bridging from occurrence. As such, the groove located under the electronic component can be formed using the current process equipment and allows the EMC to smoothly flow under the electronic component, such that voids and a subsequent popcorn effect are avoided. Further, the EMC filling the groove serves as an electrically insulating shield between the paired bond pads, thereby preventing undesirable electrical bridging between the paired bond pads.

Moreover in the present invention, exposed areas of the paired bond pads may be made equal to each other, such that same wetting areas are provided for the electronic component mounted on the bond pads by means of solder paste and surface mounted technology (SMT), and thus a tombstone effect can be avoided. Alternatively, bond pads having different surface areas can be used but are allowed to have equal areas exposed from the protective layer so as to provide same wetting areas for bonding the electronic component.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of an electronic carrier board and a package structure thereof as proposed in the present invention are described as follows with reference to FIGS. 5 to 14. It should be understood that the drawings are simplified schematic diagrams only showing the elements relevant to the present invention, and the layout of elements could be more complicated in practical implementation.

First Preferred Embodiment

Figure 5A:
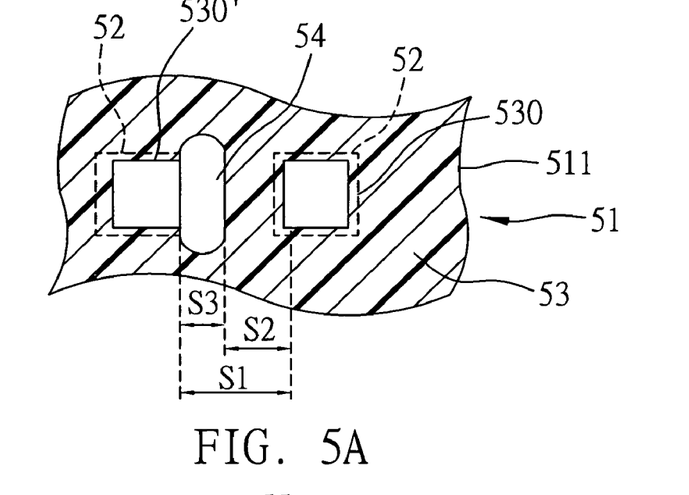
FIG. 5A is a plan view of an electronic carrier board according to a first preferred embodiment of the present invention.
Figure 5B:
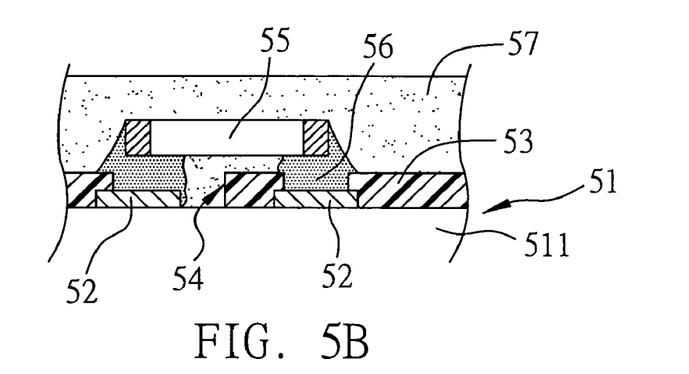
FIGS. 5B and 5C are respectively a cross-sectional view and a plan view showing a package structure of the electronic carrier board mounted with an electronic component thereon according to the first preferred embodiment of the present invention.
Figure 5C:
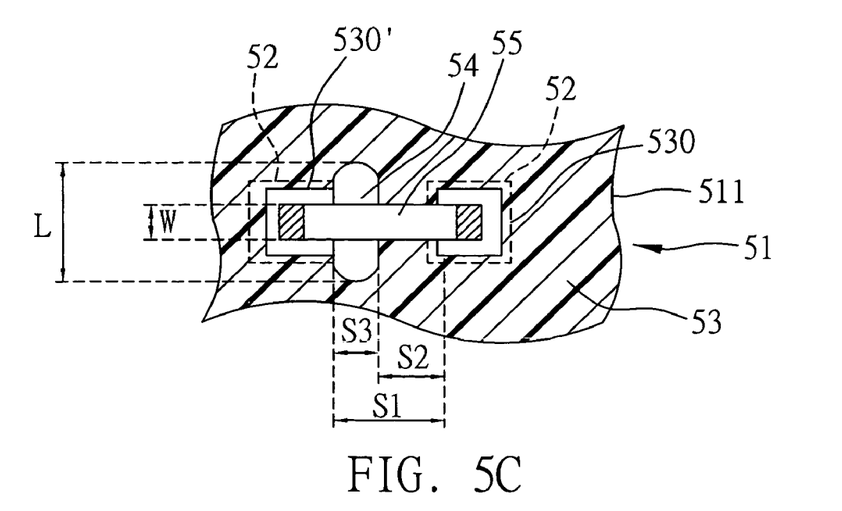

FIG. 5A shows an electronic carrier board 51 according to a first preferred embodiment of the present invention, and FIGS. 5B and 5C show a package structure of the electronic carrier board 51 mounted with an electronic component 55 thereon.

As shown in FIG. 5A, the electronic carrier board 51 comprises: a carrier 511; at least one pair of bond pads 52 formed on a surface of the carrier 511; and a protective layer 53 covering the surface of the carrier 511. The protective layer 53 is formed with openings 530, 530' through which the bond pads 52 are exposed. An elliptic groove 54 is formed between the paired bond pads 52 and is not covered by the protective layer 53. The groove 54 has a length larger than a width of an electronic component to be bonded to the paired bond pads 52, and is adjacent to one of the paired bond pads 52 (e.g. the left bond pad 52) and communicates with the corresponding opening 530'. In this embodiment, the groove 54 abuts against the left bond pad 52.

The electronic carrier board 51 can be a package substrate for chip packaging, a circuit board, or a printed circuit board. In this embodiment, the package substrate is illustrated. The carrier 511 of the electronic carrier board 51 can be an insulating layer, or an insulating layer with stacked circuit layers therein, and a plurality of conductive circuits (not shown) and the bond pads 52 are disposed on the carrier 511. The insulating layer can be made of glass fiber, epoxy resin, polyimide tape, FR4 resin, or bismaleimide triazine (BT) resin, and the circuit layers can be copper layers.

The carrier 511 of the electronic carrier board 51 is covered with the protective layer 53 that protects the conductive circuits against external damage and contamination. The protective layer 53 can be a solder mask layer made of a polymer with high fluidity, such as epoxy resin. The openings 530, 530' of the protective layer 53 are formed at positions corresponding to the bond pads 52 such that the bond pads 52 are exposed from the openings 530, 530'. In this embodiment, the bond pads 52 exposed from the protective layer 53 can be solder mask defined (SMD) bond pads whose peripheral portions are covered by the solder mask layer (the protective layer 53).

Besides the elliptic shape, the groove 54 disposed between the paired bond pads 52 may have any other shape that makes the length of the groove 54 larger than the width of the electronic component to be bonded to the bond pads 52.

As shown in FIGS. 5B and 5C, the package structure of the electronic carrier board 51 is provided, which comprises: the electronic carrier board 51, an electronic component 55, and an insulating resin such as an epoxy molding compound (EMC) 57. The electronic carrier board 51 comprises: the carrier 511; the at least one pair of bond pads 52 formed on the carrier 511; the protective layer 53 covering the carrier 511, wherein the protective layer 53 is formed with the openings 530, 530' for exposing the bond pads 52; and the groove 54 formed between the paired bond pads 52 and having a length L larger than a width W of the electronic component 55, wherein the groove 54 is adjacent to one of the paired bond pads 52 (e.g. the left bond pad 52) and communicates with the corresponding opening 530'. The electronic component 55 is mounted on the electronic carrier board 51 and bonded to the bond pads 52 exposed through the openings 530, 530'. The EMC 57 encapsulates the electronic component 55 and fills a clearance between the electronic component 55 and the electronic carrier board 51.

After a conductive material such as solder paste 56 is applied on the bond pads 52, two end portions of the electronic component 55 can be mounted to the solder paste 56 and then a reflow soldering process is performed, such that the electronic component 55 is bonded and electrically connected to the bond pads 52 by means of the solder paste 56. The electronic component 55 can be a passive component, such as a 0201-type chip passive component and an even smaller chip passive component. In this embodiment, the 0201-type chip passive component is illustrated. As shown in FIGS. 5B and 5C, in order to mount the 0201-type chip passive component on the electronic carrier board 51, a distance S1 between the two exposed paired bond pads 52 is set to 250 μm, and owing to the resolution limit of the solder mask layer (the protective layer 53), a width S3 of the groove 54 is at least 150 μm. Thus, the solder mask layer (the protective layer 53), which is formed at an edge of the bond pad 52 (not adjacent to the groove 54) and around the opening 530, i.e. formed between the groove 54 and the opening 530, has a width S2 of 100 μm (250 μm−150 μm=100 μm), which is much larger than the minimum width of 75 μm (as discussed in the Background) considered as a limit. Therefore, during a molding process performed on a package substrate mounted with the 0201-type chip passive component, the EMC 57 with fluidity, such as epoxy resin, used for encapsulating the passive component can effectively flow into a space formed by the groove 54 and the opening 530' so as to fill a clearance between the 0201-type chip passive component and the package substrate. As a result, voids and a popcorn effect in a subsequent thermal environment are prevented, and the EMC filling the groove provides an electrically insulating shielding effect between the paired bond pads such that undesirable electrical bridging between the paired bond pads can be avoided.

Compared with the prior art, the electronic carrier board and the package structure thereof in the present invention have a groove formed between a pair of bond pads provided on the electronic carrier board. The groove has a length larger than a width of an electronic component mounted on the electronic carrier board. The groove is adjacent to one of the paired bond pads, and communicates with an opening of a solder mask layer through which this bond pad is exposed. By such arrangement, the solder mask layer formed at an edge of the other one of the paired bond pads may have a width not smaller than the limit of 75 μm and also a space capable of accommodating an EMC is formed between the paired bond pads, such that the EMC can effectively fill a clearance between the electronic carrier board and the electronic component mounted thereon, and a void-induced popcorn effect and undesirable electrical bridging are prevented.

By the above arrangement, even if a compact electronic component, such as a 0201-type chip passive component, is mounted on the electronic carrier board, the EMC can still effectively fill the clearance between such electronic component and the electronic carrier board under the current process condition of having the limit of 75 μm in width of the solder mask layer formed at the edge of the bond pad, thereby preventing a popcorn effect and electrical bridging from occurrence. As such, the groove located under the electronic component can be formed using the current process equipment and allows the EMC to smoothly flow under the electronic component, such that voids and a subsequent popcorn effect are avoided. Further, the EMC filling the groove serves as an electrically insulating shield between the paired bond pads, thereby preventing electrical bridging between the paired bond pads.

Moreover in the present invention, exposed areas of the paired bond pads may be made equal to each other, such that same wetting areas are provided for the electronic component mounted on the bond pads by means of solder paste and surface mounted technology (SMT), and thus a tombstone effect can be avoided.

Second Preferred Embodiment

Figure 6A:
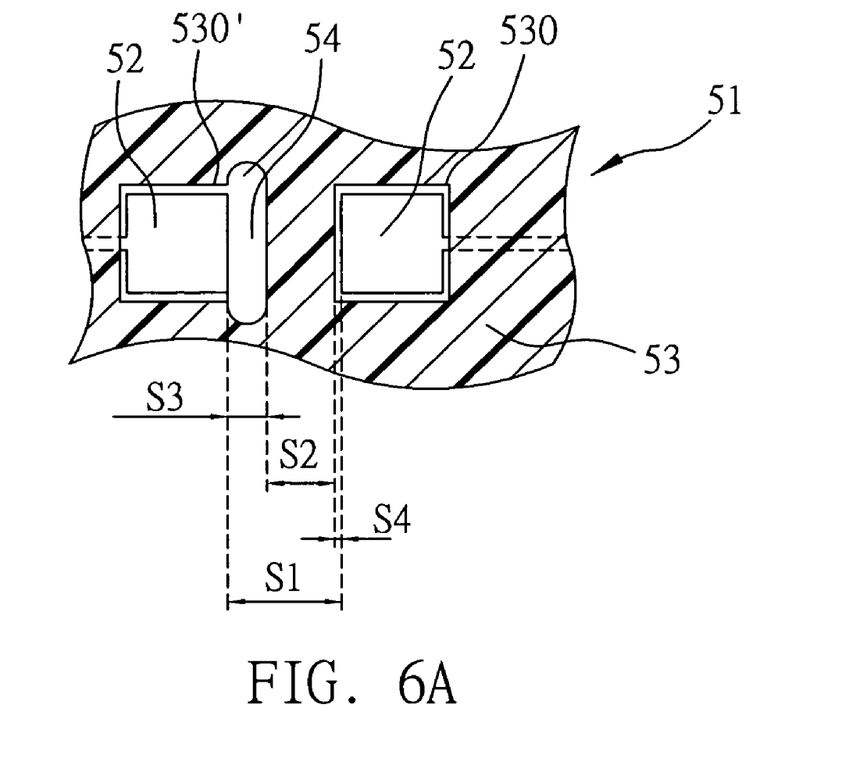
FIG. 6A is a plan view of an electronic carrier board according to a second preferred embodiment of the present invention.
Figure 6B:
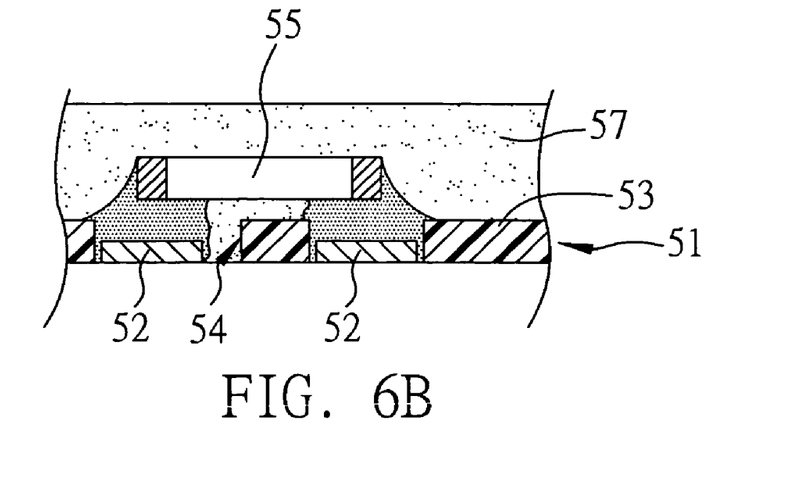
FIG. 6B is a cross-sectional view showing a package structure of the electronic carrier board mounted with an electronic component thereon according to the second preferred embodiment of the present invention.

FIGS. 6A and 6B show an electronic carrier board 51 according to a second preferred embodiment of the present invention and a package structure of the electronic carrier board 51 mounted with an electronic component 55 thereon.

The electronic carrier board 51 and the package structure thereof in the second embodiment are similar to those in the first embodiment, with a difference in that, in the second embodiment, the size of the openings 530, 530' formed in the protective layer 53 (the solder mask layer) is larger than the size of the bond pads 52, such that the bond pads 52 are completely exposed from the protective layer 53, thereby forming non-solder mask defined (NSMD) bond pads 52, as shown in FIGS. 6A and 6B.

Further as shown in FIG. 6A, a distance S1 between the exposed bond pads 52 is 250 μm, a distance S4 between an edge of the opening 530 and a corresponding edge of the NSMD bond pad 52 exposed through the opening 530 is 25 μm, and a width S3 of the groove 54 is at least 150 μm, such that a width S2 of the solder mask layer (the protective layer 53) disposed between the opening 530 and the groove 54 is still as large as 75 μm (250 μm−25 μm−150 μm=75 μm). By such arrangement, when an electronic component such as a 0201-type chip passive component is mounted on the electronic carrier board 51, the EMC 57 still can effectively flow into the groove 54 and fill a clearance between the electronic component 55 and the electronic carrier board 51.

Third Preferred Embodiment

Figure 7A:
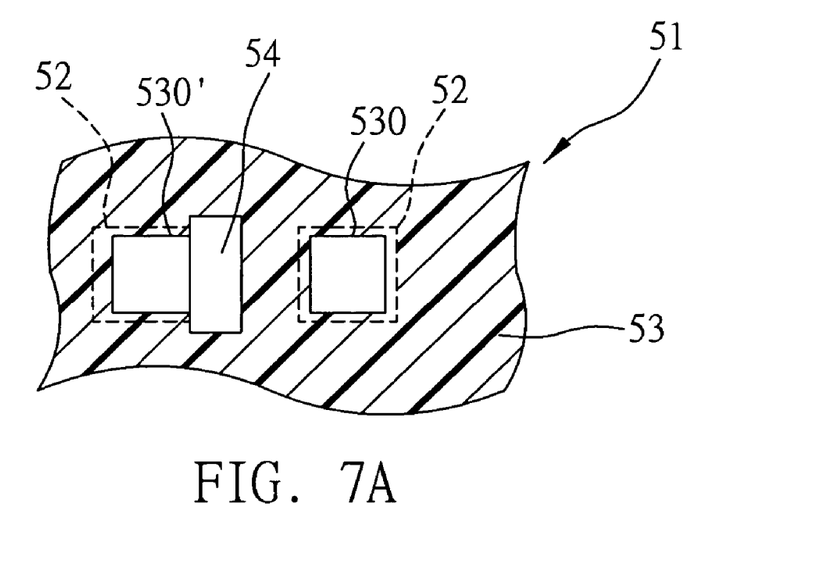
FIG. 7A is a plan view of an electronic carrier board according to a third preferred embodiment of the present invention.
Figure 7B:
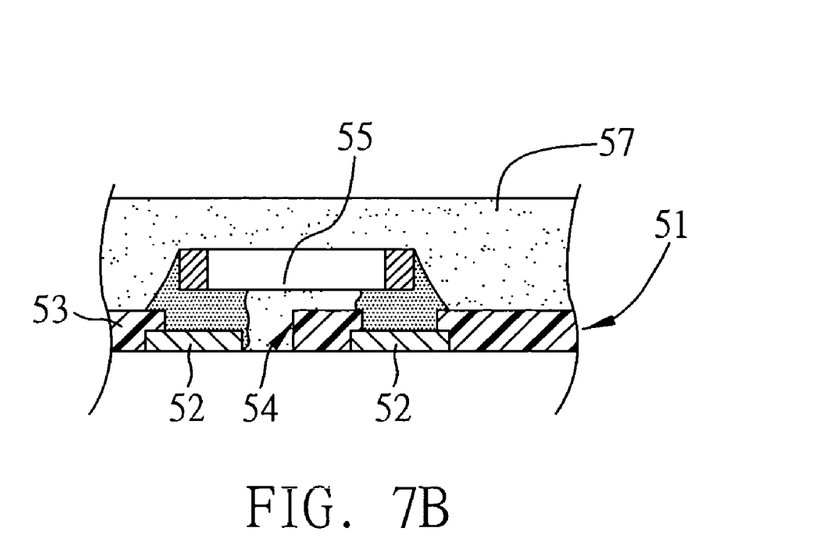
FIG. 7B is a cross-sectional view showing a package structure of the electronic carrier board mounted with an electronic component thereon according to the third preferred embodiment of the present invention.

FIGS. 7A and 7B show an electronic carrier board 51 according to a third preferred embodiment of the present invention and a package structure of the electronic carrier board mounted with an electronic component 55 thereon.

The electronic carrier board 51 and the package structure thereof in the third embodiment are similar to those in the first embodiment, with a primary difference in that, in the third embodiment, the groove 54 is rectangular in shape as shown in FIG. 7A.

It should be noted that in this embodiment, the bond pads 52 exposed from the protective layer 53 can be SMD bond pads or NSMD bond pads and thus are not limited to those shown in FIGS. 7A and 7B.

Fourth Preferred Embodiment

Figure 8A:
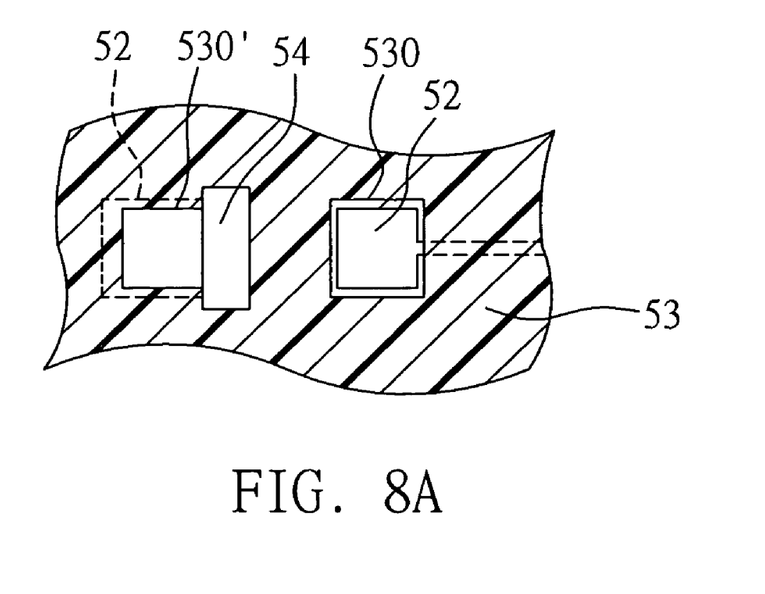
FIG. 8A is a plan view of an electronic carrier board according to a fourth preferred embodiment of the present invention.
Figure 8B:
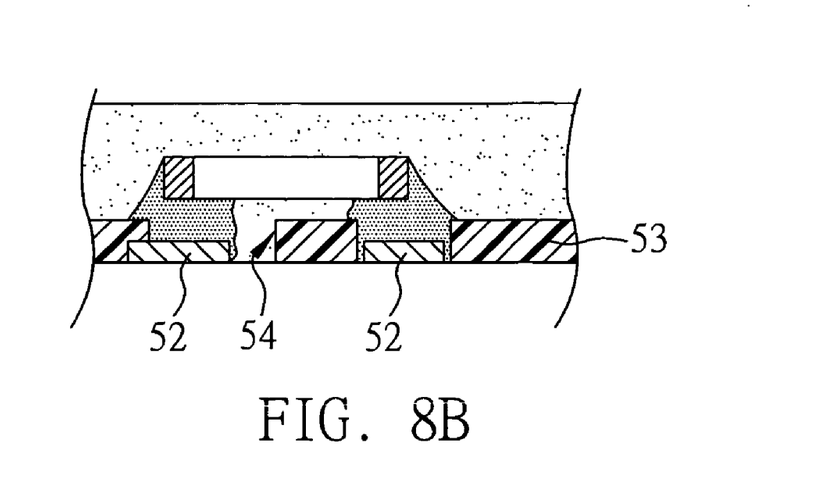
FIG. 8B is a cross-sectional view showing a package structure of the electronic carrier board mounted with an electronic component thereon according to the fourth preferred embodiment of the present invention.

FIGS. 8A and 8B show an electronic carrier board according to a fourth preferred embodiment of the present invention and a package structure of the electronic carrier board mounted with an electronic component thereon.

As shown in FIGS. 8A and 8B, the electronic carrier board and the package structure thereof in the fourth embodiment are similar to those in the third preferred embodiment, with a primary difference in that, in the fourth embodiment, the opening 530 of the protective layer 53, which does not communicate with the groove 54, has a size larger than that of a corresponding one of the paired bond pads 52, making this bond pad 52 completely exposed from the protective layer 53 and in the form of a NSMD bond pad. The other one of the paired bond pads 52 is partially exposed through the opening 530' that communicates with the groove 54 and thus is a SMD bond pad. The size of the opening 530 is also larger than that of the opening 530' that communicates with the groove 54, and the size of the opening 530' is equal to that of the NSMD bond pad 52 completely exposed through the opening 530, such that the exposed bond pads 52 provide equal wetting areas for the electronic component bonded thereto.

Fifth Preferred Embodiment

Figure 9A:
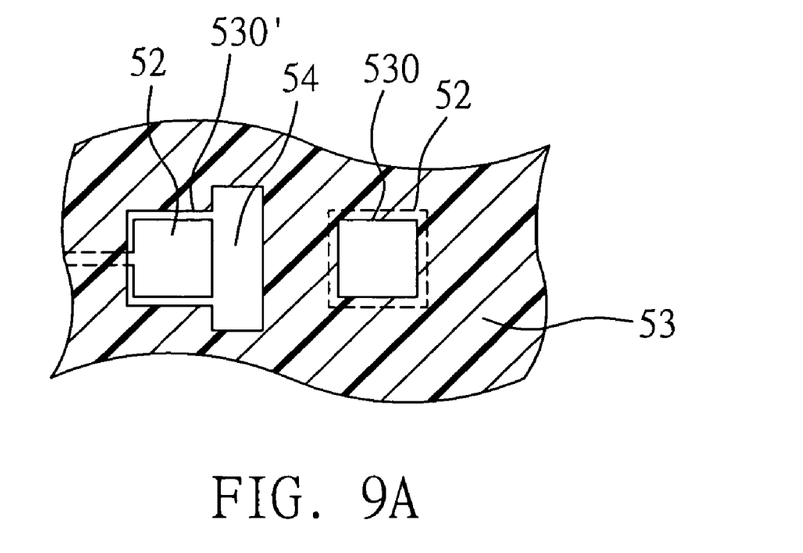
FIG. 9A is a plan view of an electronic carrier board according to a fifth preferred embodiment of the present invention.
Figure 9B:
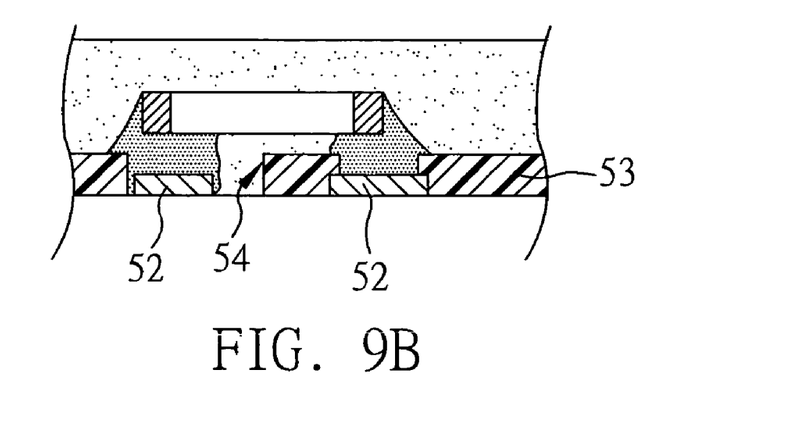
FIG. 9B is a cross-sectional view showing a package structure of the electronic carrier board mounted with an electronic component thereon according to the fifth preferred embodiment of the present invention.

FIGS. 9A and 9B show an electronic carrier board according to a fifth preferred embodiment of the present invention and a package structure of the electronic carrier board mounted with an electronic component thereon.

As shown in FIGS. 9A and 9B, the electronic carrier board and the package structure thereof in the fifth embodiment are similar to those in the third preferred embodiment, with a primary difference in that, in the fifth embodiment, the opening 530' communicating with the groove 54 has a size larger than that of a corresponding one of the paired bond pads 52, making this bond pad 52 completely exposed from the protective layer 53 and in the form of a NSMD bond pad. The other one of the paired bond pads 52 is partially exposed through the opening 530 and is a SMD bond pad.

The size of the opening 530' is larger than that of the opening 530, and the size of the opening 530 is equal to that of the NSMD bond pad 52 completely exposed through the opening 530', such that the exposed bond pads 52 provide equal wetting areas for the electronic component bonded thereto.

Sixth Preferred Embodiment

Figure 10:
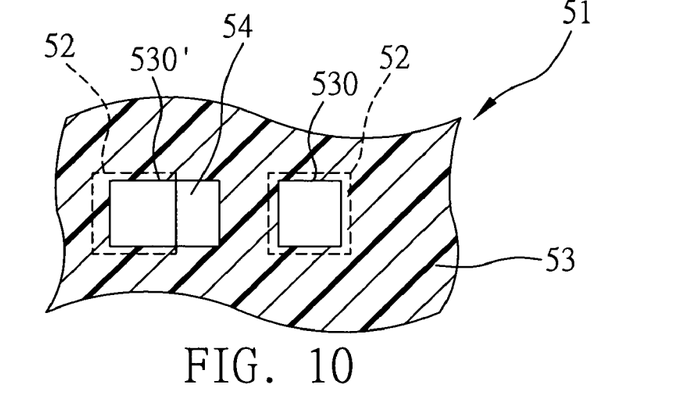
FIG. 10 is a plan view of an electronic carrier board according to a sixth preferred embodiment of the present invention.

FIG. 10 shows an electronic carrier board 51 according to a sixth preferred embodiment of the present invention.

As shown in FIG. 10, the electronic carrier board 51 of the sixth embodiment is similar to that of the third embodiment, with a primary difference in that, in the sixth embodiment, the length of the groove 54 formed between the paired bond pads 52 is larger than the width of an electronic component to be mounted on the electronic carrier board 51 and is equal to the size of the opening 530' communicating with the groove 54.

Seventh Preferred Embodiment

Figure 11:
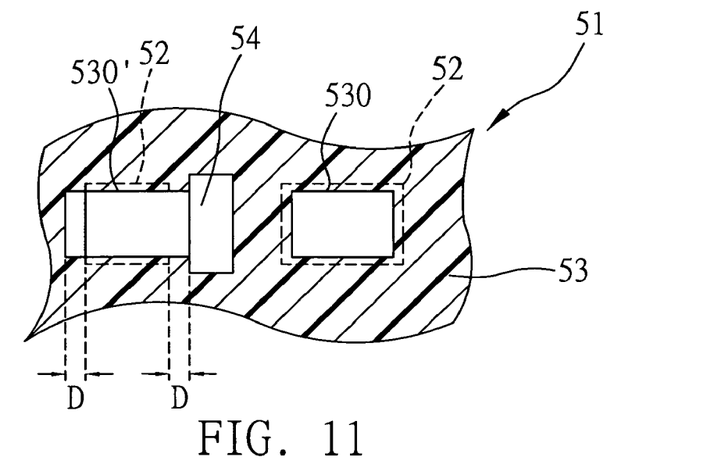
FIG. 11 is a plan view of an electronic carrier board according to a seventh preferred embodiment of the present invention.

FIG. 11 shows an electronic carrier board 51 according to a seventh preferred embodiment of the present invention.

As shown in FIG. 11, the electronic carrier board 51 of the seventh embodiment is similar to that of the third embodiment, with a primary difference in that, in the seventh embodiment, in a situation having an appropriate bond pad spacing, the left one of the bond pads 52 is formed with an extended portion that is exposed from the opening 530' of the protective layer 53 and partly abuts against the groove 54. A distance D between the left the bond pad 52 and the groove 54, corresponding to a width of the extended portion, is at least 75 μm, such that if the groove 54 is shifted in position to the left, an exposed area of the left bond pad 52 is not changed greatly and thus the subsequent wetting area provided for bonding an electronic component is not affected.

Eighth Preferred Embodiment

Figure 12:
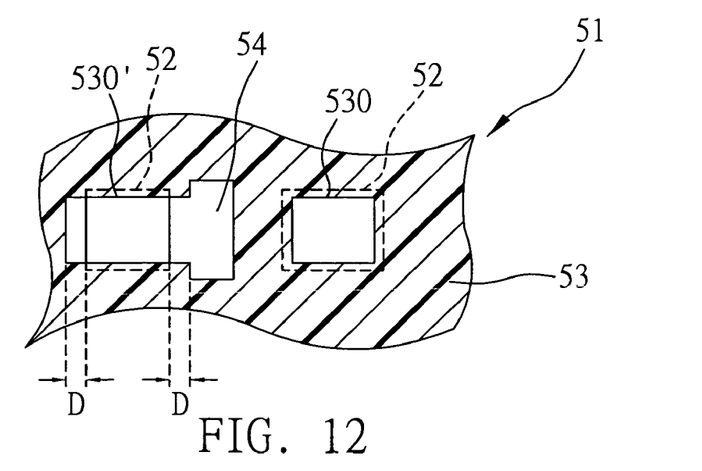
FIG. 12 is a plan view of an electronic carrier board according to an eighth preferred embodiment of the present invention.

FIG. 12 shows an electronic carrier board 51 according to an eighth preferred embodiment of the present invention.

As shown in FIG. 12, the electronic carrier board 51 of the eighth embodiment is similar to that of the third embodiment, with a primary difference in that, in the eighth embodiment, the left one of the bond pads 52 entirely does not abut against the groove 54, and a distance D between the left bond pad 52 and the groove 54 is at least 75 μm, such that if the groove 54 is shifted in position to the left, an exposed area of the left bond pad 52 is not changed and thus the subsequent wetting area provided for bonding an electronic component is not affected.

Ninth Preferred Embodiment

Figure 13:
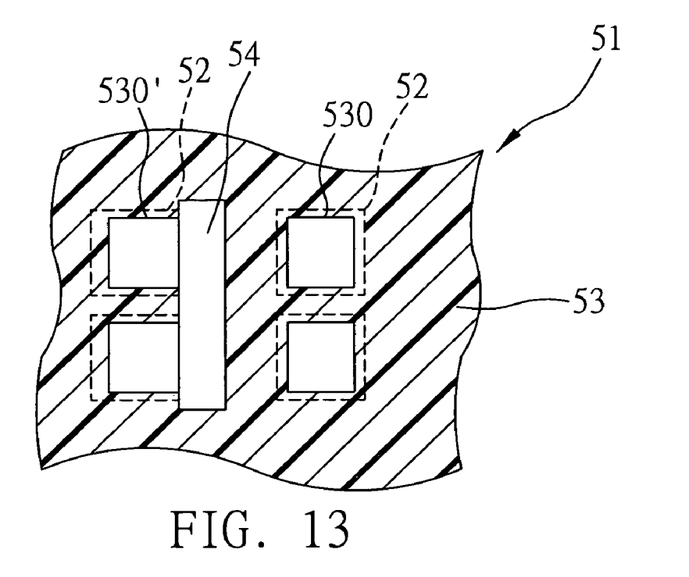
FIG. 13 is a plan view of an electronic carrier board according to a ninth preferred embodiment of the present invention.

FIG. 13 showing an electronic carrier board 51 according to a ninth preferred embodiment of the present invention.

As shown in FIG. 13, the electronic carrier board 51 of the ninth embodiment is similar to that of the third embodiment, with a primary difference in that, in the ninth embodiment, a plurality of pairs of bond pads 52 are formed on the electronic carrier board 51 to allow a plurality of electronic components (not shown) to be each mounted on one of the pairs of bond pads 52, such that the electronic components are bonded to the pairs of bond pads 52 in a side-by-side manner. For example, as shown in FIG. 13, the plurality of bond pads 52 are arranged in two rows: the left row and the right row. A plurality of openings 530, 530' are formed in the protective layer 53 to expose the plurality of bond pads 52 respectively. A groove 54 is formed between the left row and the right row of the bond pads 52 and has a length larger than a spanning distance of the electronic components disposed on the bond pads 52 side by side. The groove 54 is adjacent to the left row of bond pads 52 and communicates with the openings 530' through which the left row of bond pads 52 are exposed. Accordingly, an EMC (not shown) for encapsulating the electronic components mounted on the bond pads 52 can flow into the groove 54 and fill a clearance between the electronic components and the electronic carrier board 51, thereby preventing voids and undesirable electrical bridging from occurrence.

Tenth Preferred Embodiment

Figure 14:
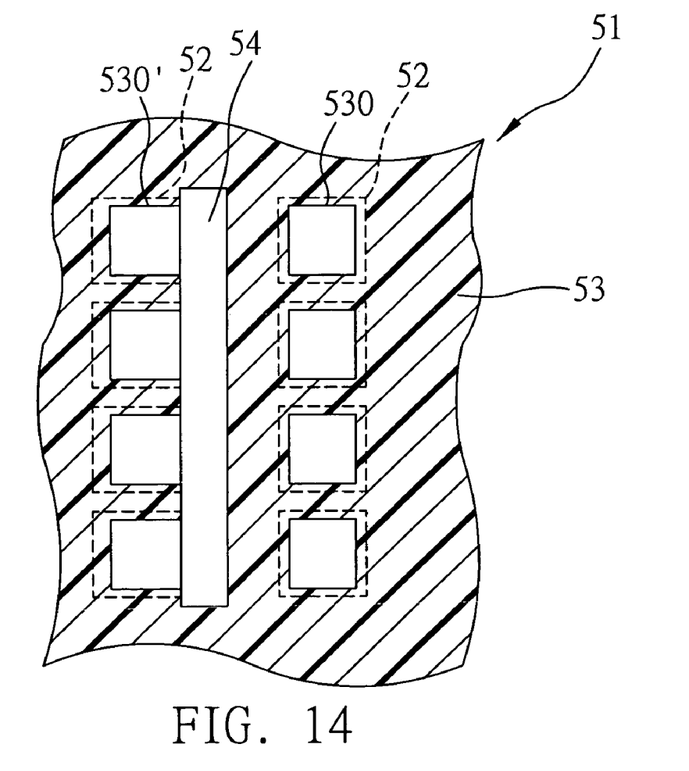
FIG. 14 is a plan view of an electronic carrier board according to a tenth preferred embodiment of the present invention.

FIG. 14 shows an electronic carrier board 51 according to a tenth preferred embodiment of the present invention.

As shown in FIG. 14, the electronic carrier board 51 of the tenth embodiment is similar to that of the third embodiment, with a primary difference in that, in the tenth embodiment, a plurality of pairs of bond pads 52 are formed on the electronic carrier board 51 to allow a large passive component, such as 0805-type passive component comprising a plurality of component units (e.g. paired capacitors or resistors) connected in parallel or in series, to be mounted thereon. For example, as shown in FIG. 14, the plurality of bond pads 52 are arranged in two rows: the left row and the right row. A plurality of openings 530, 530' are formed in the protective layer 53 to expose the plurality of bond pads 52 respectively. A groove 54 is formed between the left row and the right row of the bond pads 52 and has a length larger than a width of the 0805-type passive component. The groove 54 is adjacent to the left row of bond pads 52 and communicates with the openings 530' through which the left row of bond pads 52 are exposed.

It should be noted that each of the above preferred embodiments of the present invention may be altered and modified in light of process requirements and are not limited by the foregoing descriptions.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An electronic carrier board comprising:
a carrier;
at least one pair of bond pads formed on a surface of the carrier; and
a protective layer covering the surface of the carrier, wherein the protective layer is formed with openings through which the paired bond pads are exposed, and a groove in the protective layer is formed between the paired bond pads and has a length larger than a width of an electronic component to be mounted on the paired bond pads, and the groove is adjacent to one of the paired bond pads and communicates with a corresponding one of the openings where the one of the paired bond pads is exposed.

2. The electronic carrier board of claim 1, wherein the length of the groove is larger than or equal to a size of the corresponding one of the openings.

3. The electronic carrier board of claim 1, wherein the one of the paired bond pads at least partially abuts against the groove or is free of abutting against the groove.

4. The electronic carrier board of claim 3, wherein the one of the paired bond pads is free of abutting against the groove and is spaced apart from the groove by a distance of at least 75 μm.

5. The electronic carrier board of claim 1, wherein the electronic carrier board is one of a package substrate for chip packaging, a circuit board, and a printed circuit board.

6. The electronic carrier board of claim 1, wherein the carrier of the electronic carrier board is one of an insulating layer, and an insulating layer with stacked circuit layers therein.

7. The electronic carrier board of claim 1, wherein at least one of the bond pads has a size larger than that of a corresponding one of the openings, making the at least one bond pad formed as a solder mask defined (SMD) bond pad, or at least one of the bond pads has a size smaller than that of a corresponding one of the openings, making the at least one bond pad formed as a non-solder mask defined (NSMD) bond pads.

8. The electronic carrier board of claim 1, wherein the paired bond pads are coated with a conductive material thereon such that the electronic component is mounted on and electrically connected to the paired bond pads by means of the conductive material, and the electronic component is encapsulated by an insulating resin that fills a clearance between the electronic component and the electronic carrier board.

9. The electronic carrier board of claim 8, wherein the electronic component comprises a passive component.

10. The electronic carrier board of claim 1, wherein the paired bond pads have equal areas exposed through the openings of the protective layer.

* * * * *